(12) United States Patent
Kim et al.

(10) Patent No.: US 8,516,341 B2
(45) Date of Patent: Aug. 20, 2013

(54) METHOD, APPARATUS, AND STORAGE MEDIUM FOR PROCESSING WRITE DEFECT IN DATA STORAGE APPARATUS

(75) Inventors: Kyung-jin Kim, Uiwang-si (KR); Jae-hyuk Yu, Suwon-si (KR)

(73) Assignee: Seagate Technology International, Grand Cayman (KY)

( * ) Notice: Subject to any disclaimer, the term of this patent is extended or adjusted under 35 U.S.C. 154(b) by 367 days.

(21) Appl. No.: 12/938,547

(22) Filed: Nov. 3, 2010

(65) Prior Publication Data
US 2011/0107186 A1      May 5, 2011

(30) Foreign Application Priority Data
Nov. 4, 2009   (KR) .................... 10-2009-0106041

(51) Int. Cl.
*G06F 11/00*      (2006.01)
(52) U.S. Cl.
USPC .......................... 714/769; 714/758
(58) Field of Classification Search
USPC ................. 714/769, 758, 762, 764, 774, 786, 714/798
See application file for complete search history.

(56) References Cited

U.S. PATENT DOCUMENTS

| | | | |
|---|---|---|---|
| 6,512,644 B1 * | 1/2003 | Hall et al. ..................... 360/31 |
| 8,276,043 B2 * | 9/2012 | Yano et al. .................... 714/766 |
| 2003/0123175 A1 * | 7/2003 | Gill et al. ..................... 360/53 |
| 2008/0055765 A1 | 3/2008 | Abe et al. |

FOREIGN PATENT DOCUMENTS

| | | |
|---|---|---|
| JP | 2004047023 A | 2/2004 |
| KR | 1020080003183 A | 1/2008 |

* cited by examiner

*Primary Examiner* — Dieu-Minh Le
(74) *Attorney, Agent, or Firm* — HolzerIPLaw, PC

(57) ABSTRACT

A method is provided for correcting a write defect in a data storage apparatus comprising a storage medium. The method comprises reading information from a track of the storage medium in which a write defect occurs, calculating a number of error-corrected error correction code symbols in sectors of the track based on the read information, determining a number of sectors on which write defect correction is to be performed by comparing the calculated number of error-corrected error correction code symbols with a threshold, and performing a rewrite operation on the track, beginning at a starting sector determined by the number of sectors on which write defect correction is to be performed.

19 Claims, 12 Drawing Sheets

METHOD, APPARATUS, AND STORAGE MEDIUM FOR PROCESSING WRITE DEFECT IN DATA STORAGE APPARATUS

CROSS-REFERENCE TO RELATED APPLICATIONS

This application claims priority under 35 U.S.C. §119 to Korean Patent Application No. 10-2009-0106041 filed on Nov. 4, 2009, the disclosure of which is hereby incorporated by reference in its entirety.

BACKGROUND

Embodiments of the inventive concept relate generally to electronic data storage technologies. More particularly, embodiments of the inventive concept relate to methods of correcting write defects in a data storage apparatus.

Many electronic devices use a magnetic storage medium to store data. Data is written in the magnetic medium by applying a magnetic field to a magnetic head located near a surface of the medium. The magnetic field polarizes a portion of the medium to store the data.

During a write operation, an actuator arm moves the magnetic head to a recording track of the magnetic storage medium, and a servo system adjusts the position of the magnetic head over the track. If the position of the magnetic head is not properly positioned during the write operation, a write defect can occur. Accordingly, the servo system generates a position error signal to indicate any deviation of the magnetic head from the center of the recording track. Write defects can also occur for other reasons, including both internal and external influences.

SUMMARY

Embodiments of the inventive concept provide methods of correcting write defects by adaptively determining the number of sectors to be corrected. Embodiments of the inventive concept also provide apparatuses and data storage media for implementing the methods.

According to an embodiment of the inventive concept, a method is provided for correcting a write defect in a data storage apparatus comprising a storage medium. The method comprises reading information from a track of the storage medium in which a write defect occurs, calculating a number of error-corrected ECC symbols in sectors of the track based on the read information, determining a number of sectors on which write defect correction is to be performed by comparing the calculated number of error-corrected ECC symbols with a threshold, and performing a rewrite operation on the track, beginning at a starting sector determined by the number of sectors on which write defect correction is to be performed.

In certain embodiments, the starting sector is a sector in which the number of error-corrected ECC symbols is greater than a predetermined first threshold.

In certain embodiments, the method further comprises discontinuing a write operation upon detecting the write defect in the track.

In certain embodiments, the method further comprises detecting the write defect by inspecting a signal read from a servo information region of a recording medium during a write operation.

In certain embodiments, detecting the write defect comprises detecting that a level of a position error signal generated from a combination of burst signals read from a servo information region of the recording medium is less than a predetermined level during a write operation.

In certain embodiments, the method further comprises detecting and compensating for a defective sector in a region of the storage medium upon determining that a write defect has occurred repeatedly in the region.

In certain embodiments, detecting and compensating for the defective sector comprises reading information from the region, calculating a number of error-corrected ECC symbols in each sector of the region based on the information read from the region, identifying the defective sector as a sector of the region where the number of error-corrected ECC symbols is greater than a second threshold, and reassigning the defective sector as a spare sector.

In certain embodiments, the method further comprises, after compensating for the defective sector, performing rewriting on the track, starting from the starting sector.

In certain embodiments, the method further comprises, where the number of error-corrected ECC symbols is not greater than the threshold, determining a previously identified starting sector as the starting sector for write defect correction.

According to another embodiment of the inventive concept, a data storage apparatus comprises a recording medium, a media interface configured to access the recording medium to write information to or read information from the recording medium, and a processor configured to discontinue performance of a write operation in response to a write defect, determine a starting sector for write defect correction based on a number of error-corrected ECC symbols included in information read from a track in which the write defect is located, and to control the media interface to perform rewriting starting from the starting sector.

In certain embodiments, the processor comprises a write defect detection unit configured to detect the write defect during performance of the write operation, a write defect correction control unit configured to control the media interface to discontinue performance of the write operation in response to detection of the write defect, to read information from a sector region of a track containing the write defect, and to perform rewriting starting from the starting sector, and a write-defect corrected region determination unit configured to determine the starting sector.

In certain embodiments, the write defect detection unit detects the write defect based on a signal read from a servo information region of the recording medium during performance of the write operation.

In certain embodiments, the write defect detection unit detects the write defect by determining whether a level of a position error signal generated from burst signals read from a servo information region of the recording medium is less than an initial level during performance of the write operation.

In certain embodiments, the write-defect corrected region determination unit determines the starting sector as a sector where the number of error-corrected ECC symbols is greater than a first threshold.

In certain embodiments, the write-defect corrected region determination unit comprises an ECC processor configured to detect the error-corrected ECC symbols from among ECC symbols included in the information read from the track in which the write defect is located, and to generate information regarding the number of the error-corrected ECC symbols that occur in units of sectors, a buffer configured to store the information regarding the number of error-corrected ECC symbols, and a first determination unit configured to detect the starting sector by comparing the information regarding the number of error-corrected ECC symbols in the buffer with a first threshold.

In certain embodiments, the processor further comprises a defective sector detection unit configured to detect a defective sector in the sector region based on a repeated occurrence of a write defect, and a defect processing controller for reassigning the defective sector as a spare sector.

In certain embodiments, the defective sector detection unit comprises an ECC processor configured to generate information regarding numbers of error-corrected ECC symbols in multiple sectors of the sector region, a buffer configured to store the information regarding the numbers of error-corrected ECC symbols that occur in the multiple sectors, a second determination unit configured to detect a sector in which the number of error-corrected ECC symbols is greater than a second threshold by comparing the information stored in the buffer with the second threshold, and a defective sector determination unit configured to determine the sector detected by the second determination unit as the defective sector.

In certain embodiments, where the number of error-corrected ECC symbols is not greater than the threshold, the processor determines a previously identified starting sector as the starting sector for write defect correction.

In certain embodiments, if the write defect occurs repeatedly in a sector region, the processor controls the media interface to detect a defective sector in the same sector region, reassign the defective sector as a spare sector, and perform rewriting.

According to still another embodiment of the inventive concept, a computer readable recording medium stores program code for executing a method of correcting a write defect. The method comprises reading information from a track of the storage medium in which a write defect occurs, calculating a number of error-corrected error correction code (ECC) symbols in sectors of the track based on the read information, determining a number of sectors on which write defect correction is to be performed by comparing the calculated number of error-corrected ECC symbols with a threshold, and performing a rewrite operation on the track, beginning at a starting sector determined by the number of sectors on which write defect correction is to be performed.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

Figure 1:
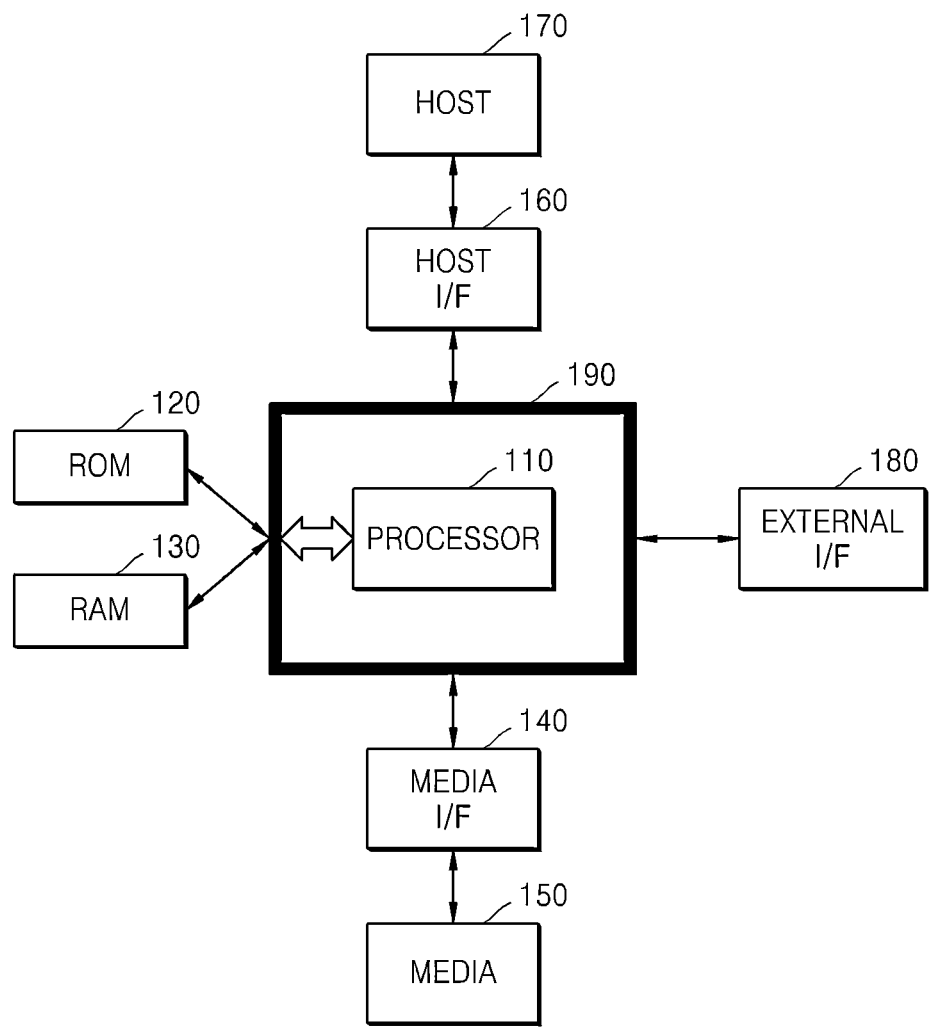
FIG. 1 is a block diagram of a data storage apparatus according to an embodiment of the inventive concept.

FIG. 1 is a block diagram of a data storage apparatus according to an embodiment of the inventive concept.

Referring to FIG. 1, the data storage apparatus comprises a processor 110, a read only memory (ROM) 120, a random access memory (RAM) 130, a media interface 140, a media unit 150, a host interface 160, a host device 170, an external interface 180, and a bus 190.

Processor 110 interprets commands and controls other elements of the data storage apparatus based on the commands. Processor 110 comprises a code object management unit (not shown), and loads code objects from media unit 150 to RAM 130 using the code object management unit. During initialization of the data storage apparatus, processor 110 loads RAM 130 with code objects for performing methods of correcting a write defects. Examples of such methods will be described in detail with reference to FIGS. 13 through 16.

Processor 110 uses the methods to determine the number of sectors on which write defect correction is to be performed, and performs rewriting tasks starting from a sector location corresponding to the determined number of sectors. Processor 110 stores information for write defect correction in media unit 150 or ROM 120. The information for write defect correction can comprise, for instance, a first threshold for detecting a starting sector on which write defect correction is to start, a second threshold for detecting a defective sector, and a reassignment sector list.

ROM 120 stores program code and data for operating the data storage apparatus. The program code and data that are stored in ROM 120 or media unit 150 is loaded to RAM 130 under control of processor 110.

In some embodiments, media unit 150 takes the form of a disk in a hard disk drive (HDD), as will be explained with reference to FIG. 2.

Figure 2:
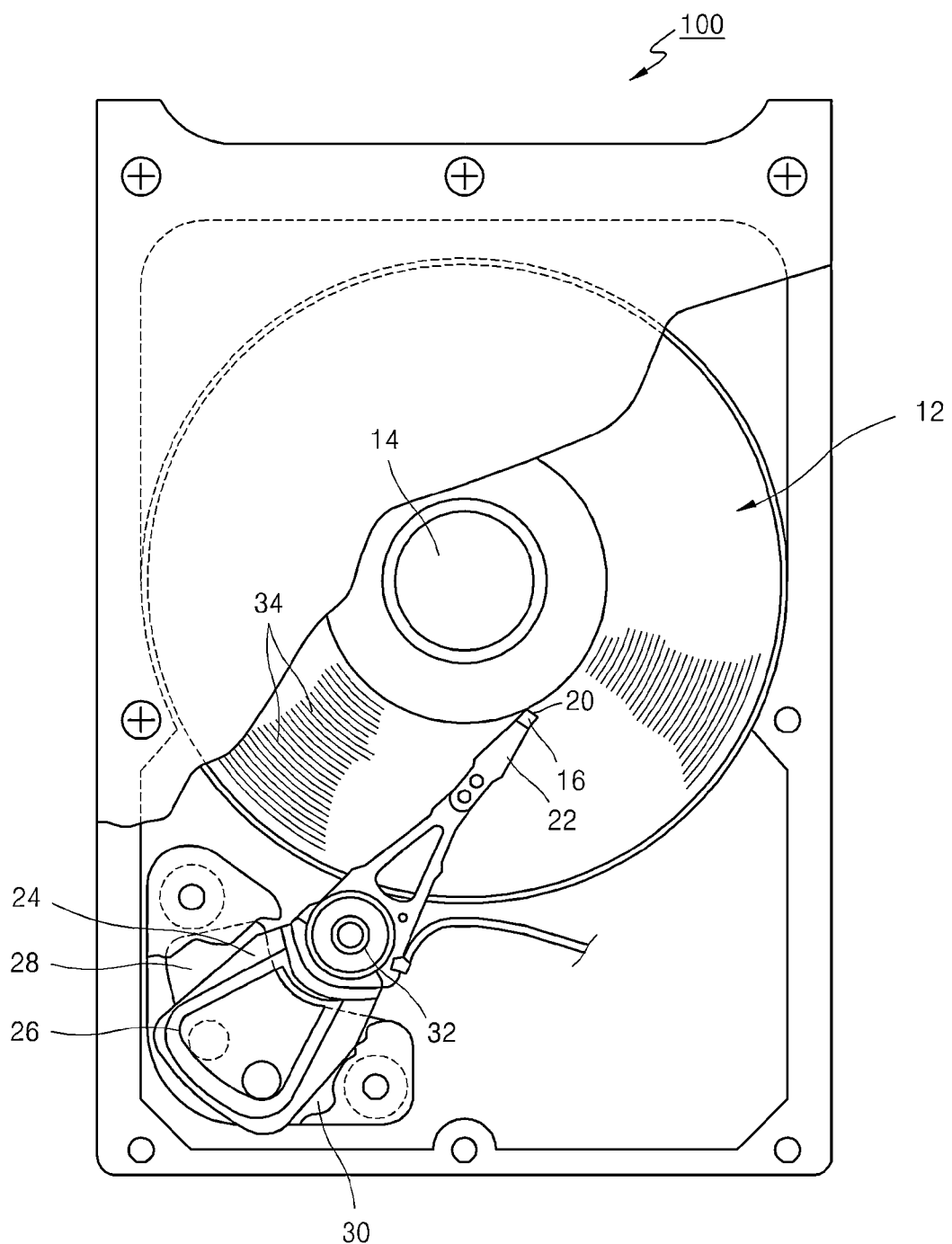
FIG. 2 is a plan view of a head disk assembly of a disk drive according to an embodiment of the inventive concept.

FIG. 2 is a plan view of a head disk assembly 100 of an HDD.

Referring to FIG. 2, head disk assembly 100 comprises at least one magnetic disk 12 that is rotated by a spindle motor (SPM) 14. Head disk assembly 100 further comprises a transducer 16 located adjacent to the surface of the at least one magnetic disk 12.

Transducer 16 senses or magnetizes the at least one magnetic disk 12 to read data from or write data to the at least one magnetic disk 12 while the at least one magnetic disk 12 is rotating. In general, transducer 16 is associated with the surface of the at least one magnetic disk 12. Although FIG. 2 illustrates a single transducer, i.e., transducer 16 can comprise two separate transducers, including a write transducer that magnetizes the at least one magnetic disk 12, and a read transducer that senses the magnetic field of the at least one magnetic disk 12. The read transducer can be a magneto-resistive (MR) device. Transducer 16 can also be referred to as a head or a magnetic head.

Transducer 16 is connected to a slider 20. Slider 20 is constructed to generate an air bearing between transducer 16 and a surface of the at least one magnetic disk 12. Slider 20 is coupled to a head gimbal assembly 22. Head gimbal assembly 22 is attached to an actuator arm 24 having a voice coil 26. Voice coil 26 is located adjacent to a magnetic assembly 28 to define a voice coil motor (VCM) 30. Current supplied to voice coil 26 generates torque that allows actuator arm 24 to pivot about a bearing assembly 32. The rotation of actuator arm 24 moves transducer 16 across the surface of the at least one magnetic disk 12.

Information is stored in annular tracks 34 of the at least one magnetic disk 12, and each of annular tracks 34 has a plurality of sectors.

Figure 3:
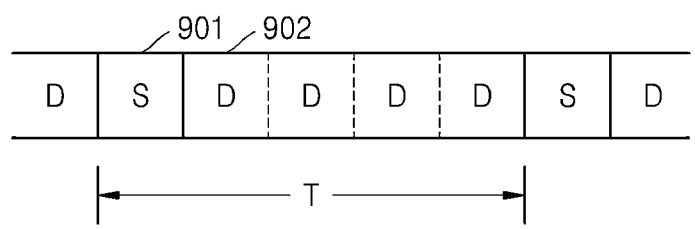
FIG. 3 illustrates sectors of a track of a disk in FIG. 2 according to an embodiment of the inventive concept.

FIG. 3 illustrates an example sector configuration for annular tracks 34 illustrated in FIG. 2. In the example of FIG. 3, a sector section "T" comprises a servo information region 901 and a data region 902. Data region 902 typically comprises a plurality of data blocks "D", but can also comprise a single data block D.

Figure 4:
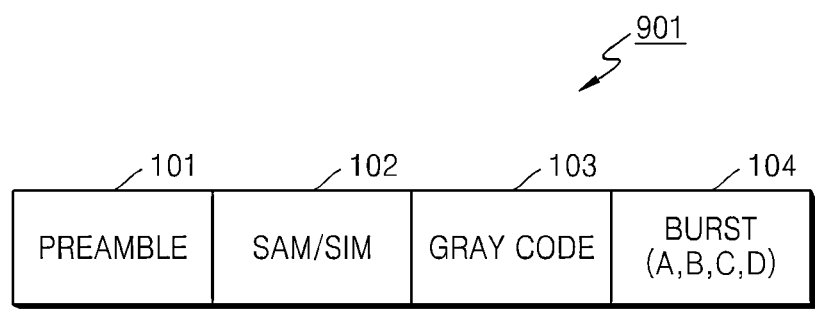
FIG. 4 illustrates a servo information region illustrated in FIG. 3 according to an embodiment of the inventive concept.

FIG. 4 illustrates an example of servo information region 901 according to an embodiment of the inventive concept.

Referring to FIG. 4, servo information region 901 comprises a preamble signal 101, a servo synchronization indication signal 102, a gray code 103, and a burst signal 104.

Preamble signal 101 provides clock synchronization during reading of servo information, and provides a timing margin by forming a gap before a servo sector. Preamble signal 101 is used to determine a gain of an automatic gain control (AGC) circuit.

Servo synchronization indication signal 102 comprises a servo address mark (SAM) and a servo index mark (SIM). The SAM is a signal indicating a start of a sector, and the SIM is a signal indicating a start of a first sector.

Gray code 103 provides track information. Burst signal 104 is used to control transducer 16 to follow a middle part of annular tracks 34. For example, burst signal 104 comprises four burst patterns A, B, C, and D. A position error signal for tracking control is generated from a combination of the four burst patterns A, B, C, and D.

In head disk assembly 100, a logical block address (LBA) is assigned to a writable region of the at least one magnetic disk 12. A writable region of the at least one magnetic disk 12 is assigned by converting the LBA into cylinder/head/sector information. The at least one magnetic disk 12 is divided into a maintenance cylinder region that a user cannot access, and a user data region that the user can access. The maintenance cylinder region is also referred to as a system region. A list of reassigned sectors is stored in the maintenance cylinder region. In the at least one magnetic disk 12, spare sectors are assigned to replace defective sectors that may occur in a user environment. For example, a predetermined number of spare sectors can be assigned to each of annular tracks 34, or to each of various track zones (not shown).

Transducer 16 is moved across the surface of the at least one magnetic disk 12 to read data from or write data to a target track. The at least one magnetic disk 12 can store a plurality of code objects for performing various operations in the disk drive. For example, the at least one magnetic disk 12 can store a code object for performing an MP3 player function, a code object for navigation, and a code object for playing various video games.

Referring again to FIG. 1, processor 110 accesses media unit 150 through media interface 140 to write or read information in media unit 150. Although not shown, media interface 140 can comprise a servo circuit for controlling head disk assembly 100, and a read/write channel circuit for performing signal processing to perform a read/write operation.

Host interface 160 is used to transmit data to or receive data from host device 170. Host interface 160 can comprise, for instance, a serial advanced technology attachment (SATA) interface, a parallel advanced technology attachment (PATA) interface, or a universal serial bus (USB) interface.

External interface 180 is used to transmit data to or receive data from an external device via an input/output terminal of the data storage apparatus. External interface 180 can comprise, for instance, an accelerated graphics port (AGP) interface, a USB interface, a firewire interface, a personal computer memory card international association (PCMCIA) interface, a local area network (LAN) interface, a Bluetooth interface, a high definition multimedia interface (HDMI), a programmable communication interface (PCI), an industry standard architecture (ISA) interface, a peripheral component interconnect-express (PCI-E) interface, an express card interface, a SATA interface, a PATA interface, or a serial interface.

Bus 190 facilitates information exchange between the elements of the data storage apparatus.

Figure 5:
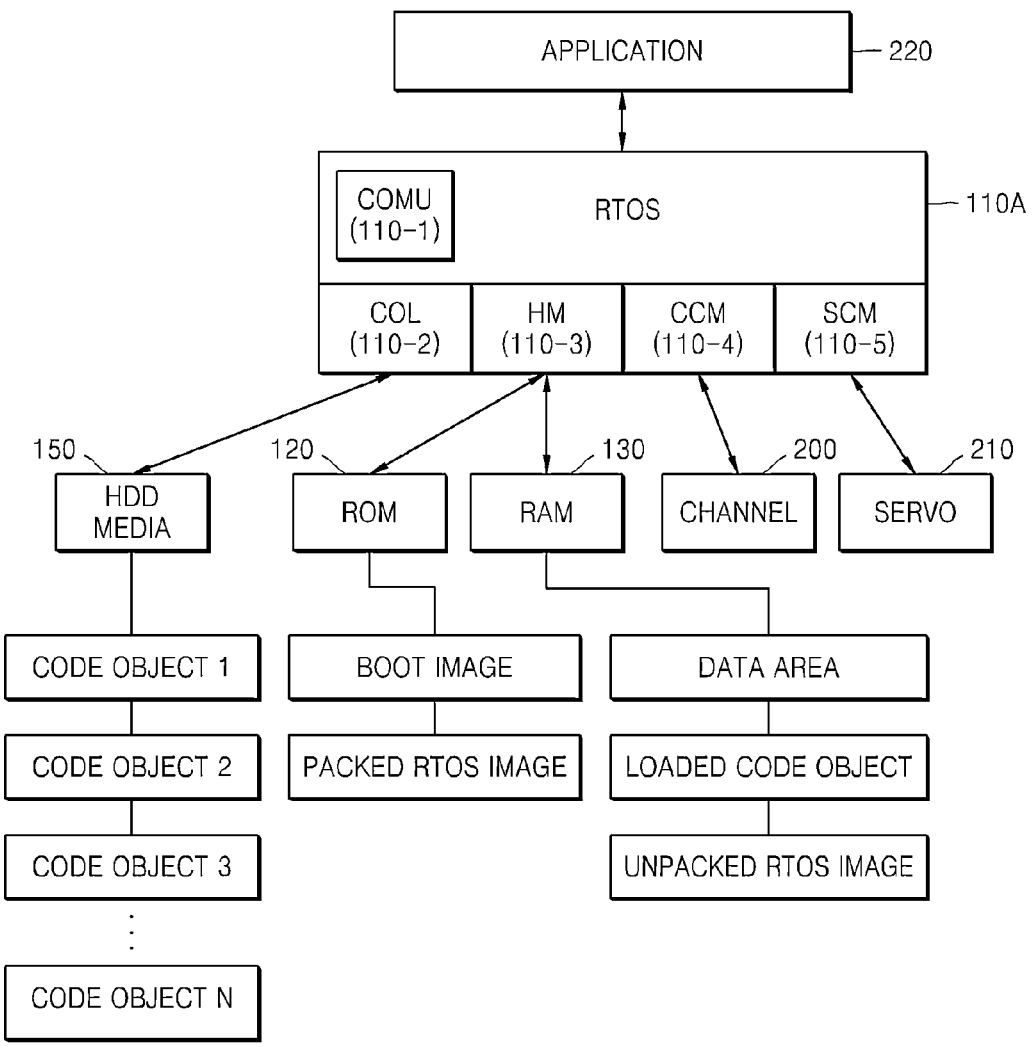
FIG. 5 is a block diagram of a software management system of the data storage apparatus of FIG. 1 according to an embodiment of the inventive concept.

FIG. 5 illustrates a software management system of the data storage apparatus of FIG. 1 according to an embodiment of the inventive concept. In the example of FIG. 5, it is assumed that the data storage apparatus of FIG. 1 is an HDD.

Referring to FIG. 5, ROM 120 stores a boot image and a packed real time operating system (RTOS) image.

Media unit 150, which comprises a disk in this example, stores a plurality of code objects 1 through N. Code objects 1 through N typically comprise code objects for operating the HDD. In addition, code objects 1 through N can comprise code objects related to functions that can be extended to the HDD. For instance, in certain embodiments, code objects 1 through N comprise code objects for performing methods to correct write defects in the HDD, such as the methods described in relation to FIGS. 13 through 16.

Code objects 1 through N could alternatively be stored in ROM 120 or elsewhere. Media unit 150 can also store code objects for performing various additional functions, such as a MP3 player functions, navigation functions, and video game functions, to name just a few.

During booting, the boot image is read from ROM 120, and an unpacked RTOS image is loaded to RAM 130. Also, a host interface stored in media unit 150, and code objects for interface operations are loaded to RAM 130. A data area is assigned to RAM 130 to store data.

To facilitate read and write operations, circuits for signal processing are included in a channel circuit 200, and circuits for controlling head disk assembly 100 are included in a servo circuit 210.

An RTOS 110A is a real-time multi-program operating system using a disk. In RTOS 110A, real-time multiplexing is performed in a foreground routine that has high priority and batch processing is performed in a background routine that has low priority according to a task. Also, RTOS 110A loads or unloads a code object in media unit 150.

RTOS 110A performs a task according to a given command by managing a code object management unit (COMU) 110-1, a code object loader (COL) 110-2, a memory handler (MH) 110-3, a channel control module (CCM) 110-4, and a servo control module (SCM) 110-5. RTOS 110A further manages an application program 220.

RTOS 110A loads code objects for controlling the HDD to RAM 130 during booting of the HDD. After booting, the HDD can operate using the code objects loaded to RAM 130.

COMU 110-1 stores location information of the code objects, transforms a virtual address of the code objects into an actual address, and performs bus arbitration. Also, COMU 110-1 stores information regarding priority of tasks that are running, and manages task control block (TCB) information and stack information used to perform tasks corresponding to a code object.

COL 110-2 loads the code objects from media unit 150 to RAM 130 or unloads code objects from RAM 130 to media unit 150 using COMU 110-1. In particular, COL 110-2 loads code objects for performing the methods of FIGS. 13 through 16, which are stored in HDD media unit 150, to RAM 130. RTOS 110A performs the methods of FIGS. 13 through 16 using the code objects loaded to RAM 130.

MH 110-3 writes data to or reads data from ROM 120 or RAM 130.

CCM 110-4 performs channel control operations required to perform signal processing for the read/write operation. SCM 110-5 performs servo control of head disk assembly 100 in read/write operations.

Figure 6:
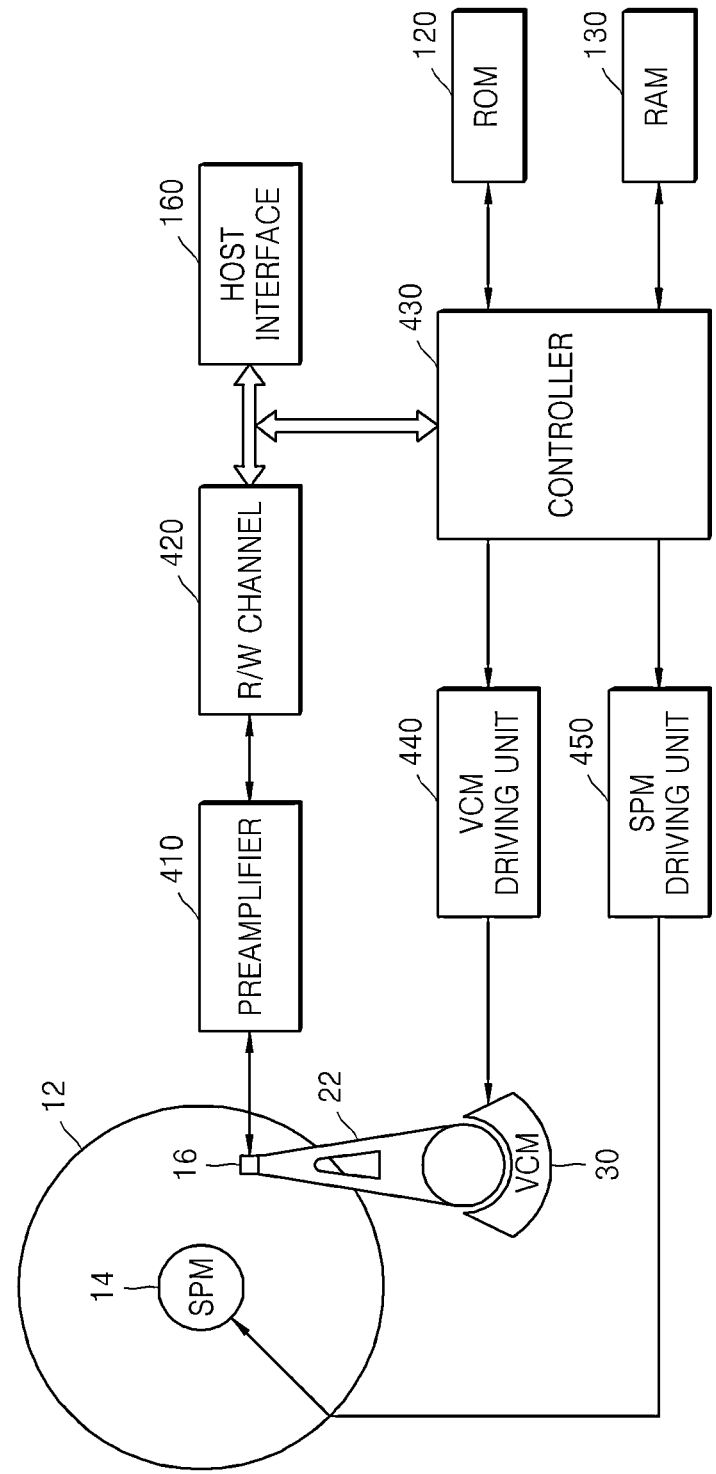
FIG. 6 is a block diagram illustrating an electrical structure of the disk drive of FIG. 2 according to an embodiment of the inventive concept.

FIG. 6 is a block diagram illustrating an electrical structure of the HDD of FIG. 2 according to an embodiment of the inventive concept. Referring to FIG. 6, the disk drive comprises a preamplifier 410, a read/write (R/W) channel 420, a controller 430, a VCM driving unit 440, an SPM driving unit 450, a ROM 120, a RAM 130, and a host interface 160.

Controller 430 can comprise, for instance, a digital signal processor (DSP), a microprocessor, or a processor. Controller 430 controls the R/W channel 420 to read information from or write information to the at least one magnetic disk 12 according to a command received from a host device (not shown) via host interface 160.

Controller 430 is coupled to VCM driving unit 440 to supply a driving current to VCM 30. Controller 430 supplies a control signal to VCM driving unit 440 to control movement of magnetic head 16.

Controller 430 is also coupled to SPM driving unit 450 for supplying a driving current in order to drive SPM 14. When power is supplied to controller 430, controller 430 supplies a control signal to SPM driving unit 450 to rotate SPM 14 at a desired speed.

Controller 430 is also coupled to ROM 120 and RAM 130. ROM 120 stores firmware and control data for controlling the disk drive. ROM 120 also stores program code and information for performing the methods of FIGS. 13 through 16. Alternatively, the program code and information for performing the methods of FIGS. 13 through 16 can be stored in the maintenance cylinder region of the at least one magnetic disk 12.

In a read operation of the disk drive, magnetic head 16 senses an electrical signal from the at least one magnetic disk 12, and preamplifier 410 amplifies the signal. Next, R/W channel 420 detects data by amplifying the signal output from preamplifier 410 using an AGC circuit (not shown) that automatically varies a gain according to an amplitude of a signal, converting the amplified signal into a digital signal, and decoding the digital signal. Controller 430 performs error correction on the data by using, for example, a Reed Solomon code. Controller 430 then transforms the error-corrected data into stream data, and transmits the stream data to the host device via host interface 160.

Controller 430 performs an ECC scan operation to generate information regarding the number of error-corrected ECC symbols that occur in units of sectors from among ECC symbols included in information read from the at least one magnetic disk 12. As explained in further detail with reference to FIG. 14, the number of error-corrected ECC symbols can be detected by noting the number of ECC symbols that are error-corrected during an ECC decoding process.

In a write operation of the disk drive, host interface 160 receives data from the host device. Controller 430 adds an ECC symbol to the data according to a Reed Solomon code. R/W channel 420 encodes the data so that it is suitable for a writing channel, and then preamplifier 410 generates a write current to write the data on the at least one magnetic disk 12 via magnetic head 16.

To correct a write defect using the methods of FIGS. 13 through 16, controller 430 loads program code and information for performing one of the methods, to RAM 130 from ROM 120 or the at least one magnetic disk 12, and controls the elements of the disk drive of FIG. 6 to perform the method based on the program code and information loaded to RAM 130.

Figure 7:
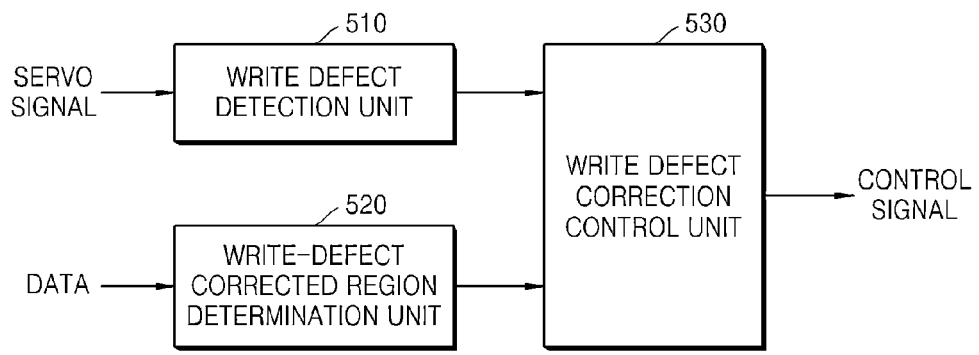
FIG. 7 is a block diagram of an apparatus for correcting a write defect in a data storage apparatus according to an embodiment of the inventive concept.
Figure 8:
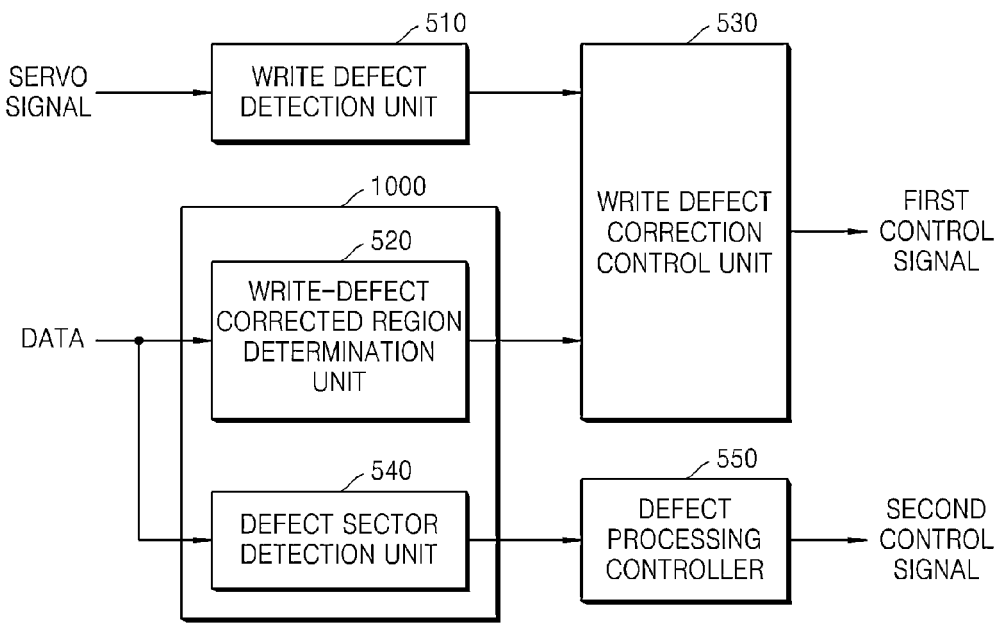
FIG. 8 is a block diagram of an apparatus for correcting a write defect in a data storage apparatus according to another embodiment of the inventive concept.

FIGS. 7 and 8 are block diagrams illustrating apparatuses for correcting a write defect in a data storage apparatus according to various embodiments of the inventive concept. The apparatuses of FIGS. 7 and 8 can be incorporated in either processor 110 of the data storage apparatus illustrated in FIG. 1 or controller 430 of FIG. 6. Alternatively, they can be designed to have a separate circuit construction.

In the embodiment of FIG. 7, the apparatus for correcting a write defect comprises a write defect detection unit 510, a write-defect corrected region determination unit 520, and a write defect correction control unit 530.

During a write operation, write defect detection unit 510 determines whether a write defect occurs, based on signals read from servo information region 901 of the at least one magnetic disk 12. Where at least one signal has a defect from among preamble signal 101, servo synchronization indication signal 102, gray code 103, and burst signal 104, write defect detection unit 510 detects the occurrence of a write defect and generates a write defect detection signal. For example, during the write operation, write defect detection unit 510 can determine that a write defect has occurred when the level of a position error signal generated from burst signal 104 is below a predetermined level. Where the level of the position error signal is less than the predetermined level, tracking control cannot be performed normally.

Figure 9A:
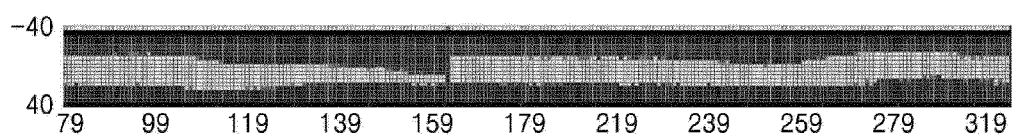
FIG. 9A is a waveform diagram of a position error signal as a function of sector location when a write defect occurs in a write operation of a data storage apparatus.
Figure 9B:
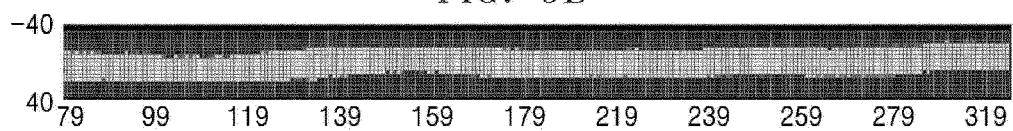
FIG. 9B is a waveform diagram of a position error signal as a function of sector location of when a write defect does not occur in a write operation of a data storage apparatus.

FIG. 9A is a waveform diagram of a position error signal as a function of sector location when a write defect occurs in a write operation of a data storage apparatus. FIG. 9B is a waveform diagram of a position error signal as a function of sector location of when a write defect does not occur in a write operation of a data storage apparatus.

In FIGS. 9A and 9B, the x-axis indicates a sector number and the y-axis indicates the magnitude of the position error signal.

In the example of FIG. 9A, the magnitude of the position error signal decreases abnormally when the sector number is about '139' to about '159'. Accordingly, write defect detection unit 510 detects a write defect around the sectors numbered '139' to '159' and generates the write defect detection signal.

Write defect correction control unit 530 receives the write defect detection signal and discontinues the write operation. In addition, write defect correction control unit 530 stores, in an internal register (not shown) of processor 110, information regarding the sector on which the write operation is discontinued due to the occurrence of the write defect. Thereafter, write defect correction control unit 530 generates a control signal to read information from the sector in which the write defect occurred. In response to the control signal generated by write defect correction control unit 530, media interface 140 accesses media unit 150 to read information from a data region of the sector in which the write defect occurred.

Write-defect corrected region determination unit 520 calculates the number of error-corrected ECC symbols that occur in units of sectors from among ECC symbols included in the information read from the data region by performing the ECC scan operation, and then determines a starting sector on which write defect correction is to start based on the calculated number of the ECC symbols that are error-corrected. The starting sector is typically a sector that is likely to include write defects.

Figure 10:
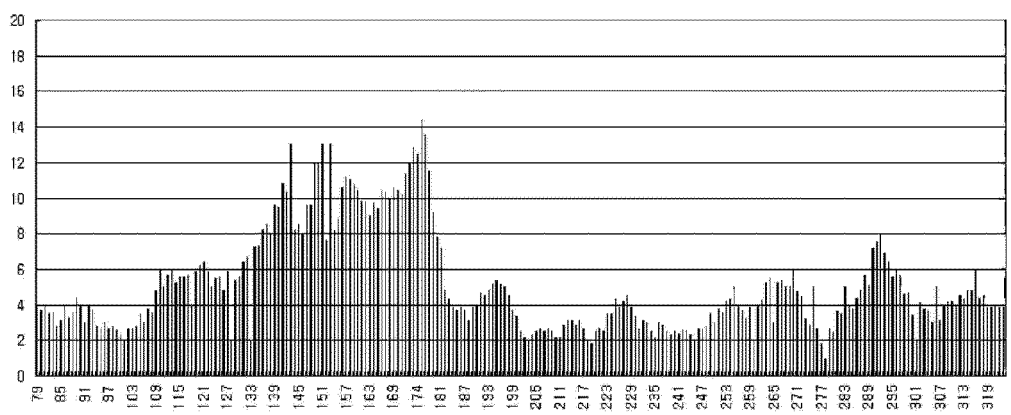
FIG. 10 is a graph illustrating a distribution of error-corrected error correction code (ECC) symbols calculated by ECC scanning when a write defect occurs as illustrated in FIG. 9A.

FIG. 10 illustrates the distribution of error-corrected ECC symbols in the sectors of FIG. 9A. As indicated by FIG. 10, the number of error-corrected ECC symbols is above average in a sector range between about '110' and about '180'.

Figure 11:
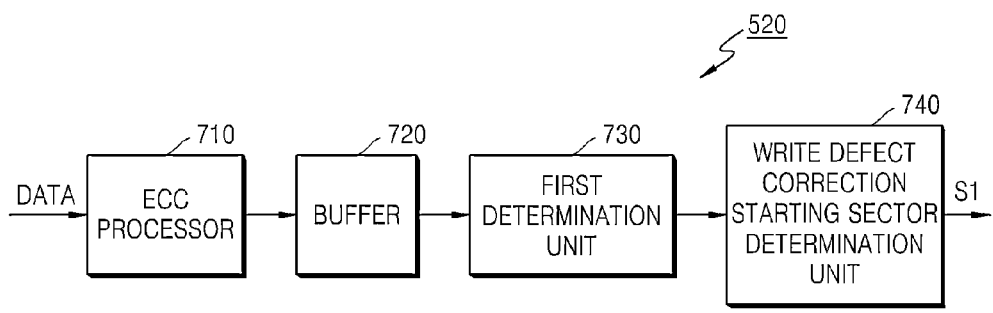
FIG. 11 is a block diagram of a write-defect corrected region determination unit in the apparatus of FIG. 7 or 8 according to an embodiment of the inventive concept.

FIG. 11 illustrates an embodiment of write-defect corrected region determination unit 520.

Referring to FIG. 11, write-defect corrected region determination unit 520 comprises an ECC processor 710, a buffer 720, a first determination unit 730, and a write defect correction starting sector determination unit 740.

ECC processor 710 detects error-corrected ECC symbols from among the ECC symbols included in the information read from the data region by using the ECC scan operation and generates information regarding the number of error-corrected ECC symbols that occur in each sector. ECC processor 710 detects and corrects ECC symbols in which an error occurs by using, for example, a Reed Solomon (RS) decoder. Thus, the information regarding the number of error-corrected ECC symbols that occur in units of sectors is generated by counting the number of error-corrected ECC symbols in units of sectors.

The number of error-corrected ECC symbols calculated by ECC processor 710 is stored in buffer 720. Thus, buffer 720 stores the numbers of error-corrected ECC symbols in all the respective sectors, together with information regarding the sectors.

First determination unit 730 compares the information regarding the number of error-corrected ECC symbols, which is read from buffer 720, with a first threshold to detect a starting sector in which the number of the error-corrected ECC symbols is greater than the first threshold. The first threshold is less than or equal to a maximum number of ECC symbols that is required to normally perform error correction in a sector. For example, the first threshold can be 70% less than the maximum number of ECC symbols that can be used to normally perform error correction in each of the sectors. Accordingly, rewriting can be performed starting from a sector that is potentially defective.

Write defect correction starting sector determination unit 740 determines the starting sector in which the number of error-corrected ECC symbols is greater than the first threshold, which was detected by first determination unit 730, to be a starting sector on which write defect correction is to start, and then outputs information S1 to indicate the starting sector.

Where first determination unit 730 determines that the information regarding the number of error-corrected ECC symbols read from buffer 720 is not greater than the first threshold, write defect correction starting sector determination unit 740 determines a previous sector as a start sector for write defect correction. The previous sector is a sector in which a write operation was previously discontinued due to the occurrence of a write defect.

As indicated by the foregoing, a starting sector on which write defect correction is to start can be determined when a write defect occurs, and the number of sectors on which rewriting should be performed is determined by the location of the starting sector.

Referring again to FIG. 7, write defect correction control unit 530 receives information S1 regarding the starting sector from write-defect corrected region determination unit 520, and then generates a control signal for performing rewriting starting from the starting sector on which write defect correction is to start. That is, write defect correction control unit 530 controls the write operation, which was discontinued due to the write defect, to be performed again starting from the starting sector. Accordingly, media interface 140 accesses the recording medium and performs rewriting starting from the starting sector on which write defect correction is to start, according to the control signal generated by write defect correction control unit 530.

In the embodiment of FIG. 8, the apparatus for correcting a write defect comprises write defect detection unit 510, write-defect corrected region determination unit 520, write defect correction control unit 530, a defective sector detection unit 540, and a defect processing controller 550. A block 1000 comprising write-defect corrected region determination unit 520 and defective sector detection unit 540 is illustrated in detail in FIG. 12.

In the embodiment of FIG. 8, the operations of write defect detection unit 510 and write defect correction control unit 530 are the same as described above with reference to FIG. 7.

Figure 12:
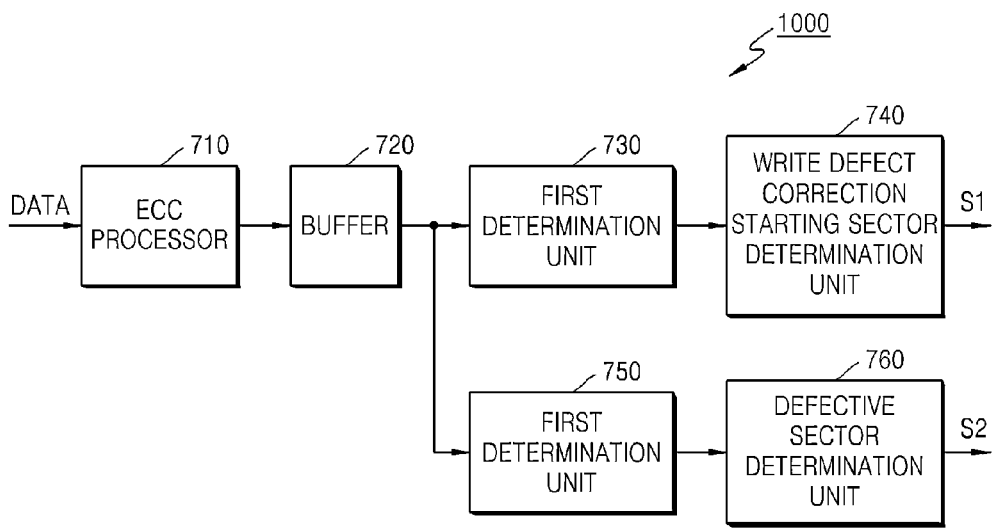
FIG. 12 is a block diagram of a block included in the apparatus of FIG. 8 according to an embodiment of the inventive concept.

Referring to FIG. 12, block 1000 comprises ECC processor 710, buffer 720, first determination unit 730, write defect correction starting sector determination unit 740, a second determination unit 750, and a defective sector determination unit 760. ECC processor 710 and buffer 720 are used commonly by write-defect corrected region determination unit 520 and defective sector detection unit 540. Defective sector detection unit 540 illustrated in FIG. 8 is a block comprising ECC processor 710, buffer 720, second determination unit 750, and defective sector determination unit 760.

ECC processor 710 calculates information regarding the number of error-corrected ECC symbols that occur in each sector of a track designated by a write command, in which a write defect occurs. ECC processor 710 calculates the information by performing an ECC scan operation as described above with reference to FIG. 8. ECC processor 710 then stores the information in buffer 720. Buffer 720 stores the information regarding the number of error-corrected ECC symbols, together with information regarding the sectors.

First determination unit 730 compares the information regarding the number of error-corrected ECC symbols read from buffer 720 with a first threshold in order to detect a starting sector in which the number of error-corrected ECC symbols is greater than the first threshold.

Write defect correction starting sector determination unit 740 determines the starting sector detected by first determination unit 730 as a starting sector on which write defect correction is to start and then outputs information S1 regarding the starting sector.

Where first determination unit 730 determines that the information regarding the number of error-corrected ECC symbols read from buffer 720 is not greater than the first threshold, write defect correction starting sector determination unit 740 determines a previous sector as a start sector for write defect correction. The previous sector is a sector in which a write operation was previously discontinued due to the occurrence of a write defect.

Where a write defect occurs two or more times when the write operation is performed according to the same write command, i.e., when the write defect occurs repeatedly in the same sector region, second determination unit 750 operates.

Second determination unit 750 compares the information regarding the number of error-corrected ECC symbols read from buffer 720 with a second threshold in order to detect a sector in which the number of error-corrected ECC symbols is greater than the second threshold. The second threshold may be the same as the first threshold but can be different from the first threshold.

Defective sector determination unit 760 determines a sector in which the number of error-corrected ECC symbols detected by second determination unit 750 is greater than the second threshold to be a defective sector and then outputs information S2 regarding the defective sector.

Referring again to FIG. 8, as described above with reference to FIG. 12, where a write defect occurs initially when the write operation is performed according to a write command, then write defect correction control unit 530 receives information S1 regarding the starting sector from write-defect corrected region determination unit 520 and generates a first control signal for performing rewriting starting from the starting sector on which write defect correction is to start. Media interface 140 accesses media unit 150 according to the first control signal generated by write defect correction control unit 530, and performs rewriting starting from the starting sector on which write defect correction is to start. That is, the write operation that was discontinued due to the occurrence of the write defect is performed again starting from the starting sector on which write defect correction is to start.

However, where the same write defect occurs repeatedly where the write operation is performed according to a write command, write defect correction control unit 530 receives information S2 regarding the defective sector from defective sector detection unit 540 and generates a second control signal for processing the defective sector. The defective sector is reassigned as a spare sector according to the second control signal. Thereafter, write defect correction control unit 530 receives information S1 regarding the starting sector from write-defect corrected region determination unit 520, and controls media interface 140 to perform rewriting starting from the starting sector on which write defect correction is to start.

FIGS. 13 through 16 illustrate a method of correcting a write defect under the control of processor 110 of the data storage apparatus of FIG. 1 or controller 430 of the disk drive of FIG. 6 according to various embodiments of the inventive concept.

Figure 13:
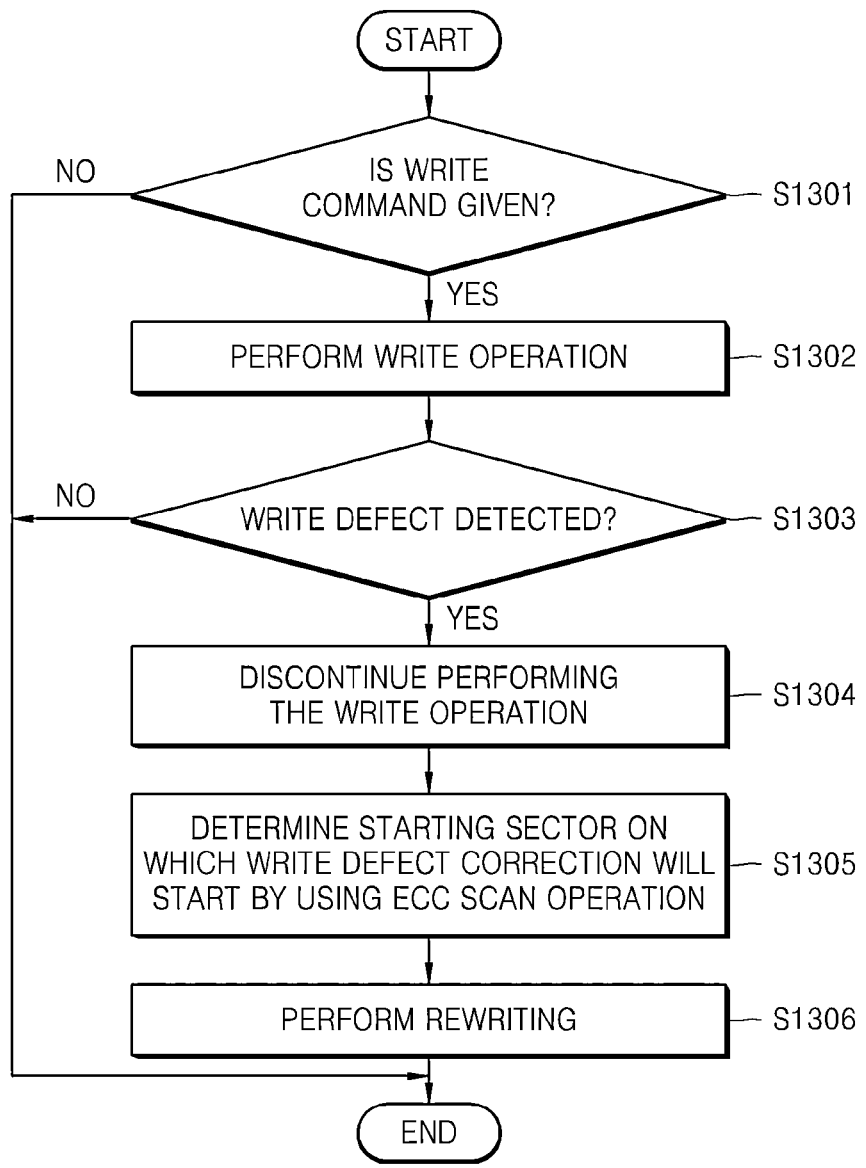
FIG. 13 is a flowchart illustrating a method of correcting a write defect in a data storage apparatus according to an embodiment of the inventive concept.

In the embodiment of FIG. 13, processor 110 or controller 430 determines whether a write command is given from host device 170 (S1301).

Where the write command is given, received data is written to a sector region of a track of a recording medium designated by the write command (S1302).

Next, the method determines whether a write defect occurs during the writing of the data (S1303). Where the data storage apparatus is a disk drive, the occurrence of the write defect can be determined based on a signal read from servo information region 901 of magnetic disk 12. In particular, where a defect occurs in at least one signal among preamble signal 101, servo synchronization indication signal 102, gray code 103, and burst signal 104 of FIG. 3, then the method can determine the occurrence of a write defect. For instance, where the level of a position error signal generated from burst signal 104 is less than a predetermined level, then it may be determined that the write defect has occurred.

Where it is determined in S1303 that the write defect has occurred (S1303=Yes), performance of the write operation is discontinued (S1304).

Next, a starting sector for write defect correction is determined by performing an ECC scan operation (S1305). More particularly, the sector on which write defect correction is to start is determined by comparing a threshold value against the number of error-corrected ECC symbols that occur in units of sectors. The number of error-corrected ECC symbols is calculated in a sector region of a track designated by the write command by performing ECC scanning.

Figure 14:
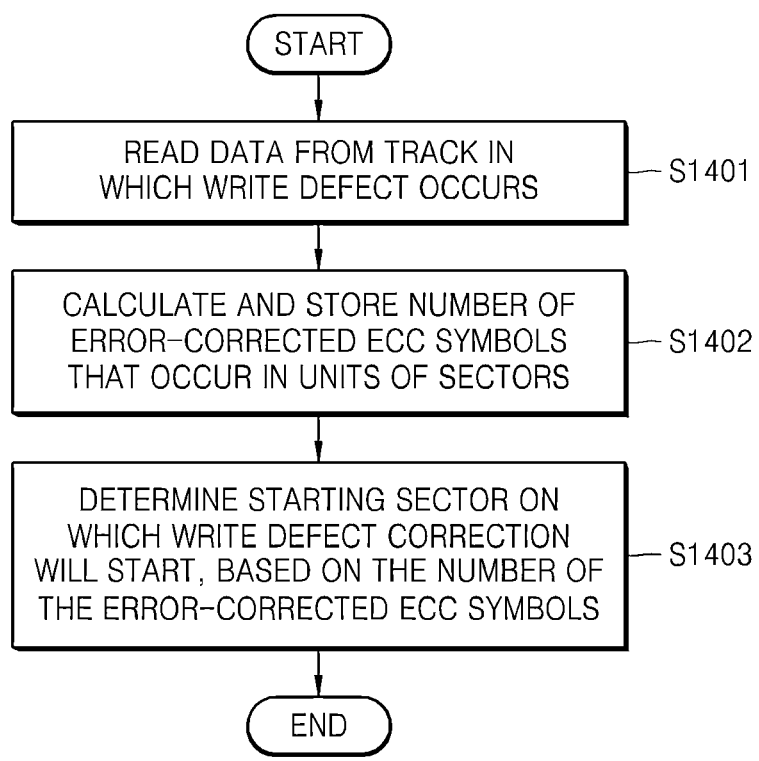
FIG. 14 is a flowchart illustrating a method of determining a starting sector on which to start write defect correction according to an embodiment of the inventive concept.

FIG. 14 illustrates a method of determining a starting sector on which write defect correction is to start. In the method of FIG. 14, data is first read from a track in which a write defect occurs (S1401). In particular, data is read from a sector region of a track designated by a write command, in which a write defect occurs.

Next, an ECC scan operation is performed to determine the number of error-corrected ECC symbols that occur in each sector of the sector region, and the number of error-corrected ECC symbols is then stored (S1402). That is, ECC symbols that are error-corrected during an ECC decoding process are detected from among ECC symbols included in data read by performing ECC scanning, and information regarding the number of error-corrected ECC symbols that occur in units of sectors is calculated and stored. For example, ECC symbols in which an error occurs may be detected using an RS decoder from among the ECC symbols, and may then be error-corrected. Then, the information regarding the number of error-corrected ECC symbols that occur in units of sectors may be calculated by summing up the numbers of error-corrected ECC symbols that occur in units of sectors.

Next, a starting sector on which write defect correction is to start is determined based on the number of error-corrected ECC symbols calculated in S1402 (S1403). For example, the number of error-corrected ECC symbols calculated in S1402 may be compared with a first threshold, and then, a starting sector in which the number of error-corrected ECC symbols is greater than the first threshold may be determined to be the starting sector on which write defect correction is to start. Where the number of error-corrected ECC symbols calculated in S1402 is not greater than the first threshold, a previous sector that has initially been determined based on the location of a sector on which the write operation was discontinued due to the occurrence of a write defect may be determined as a sector on which write defect correction is to start.

Referring again to FIG. 13, a rewriting operation is performed starting from the starting sector on which write defect correction is to start, as determined in S1305 (S1306). That is, the write operation that was discontinued due to the occurrence of the write defect is performed again starting from the starting sector on which write defect correction is to start.

Figure 15:
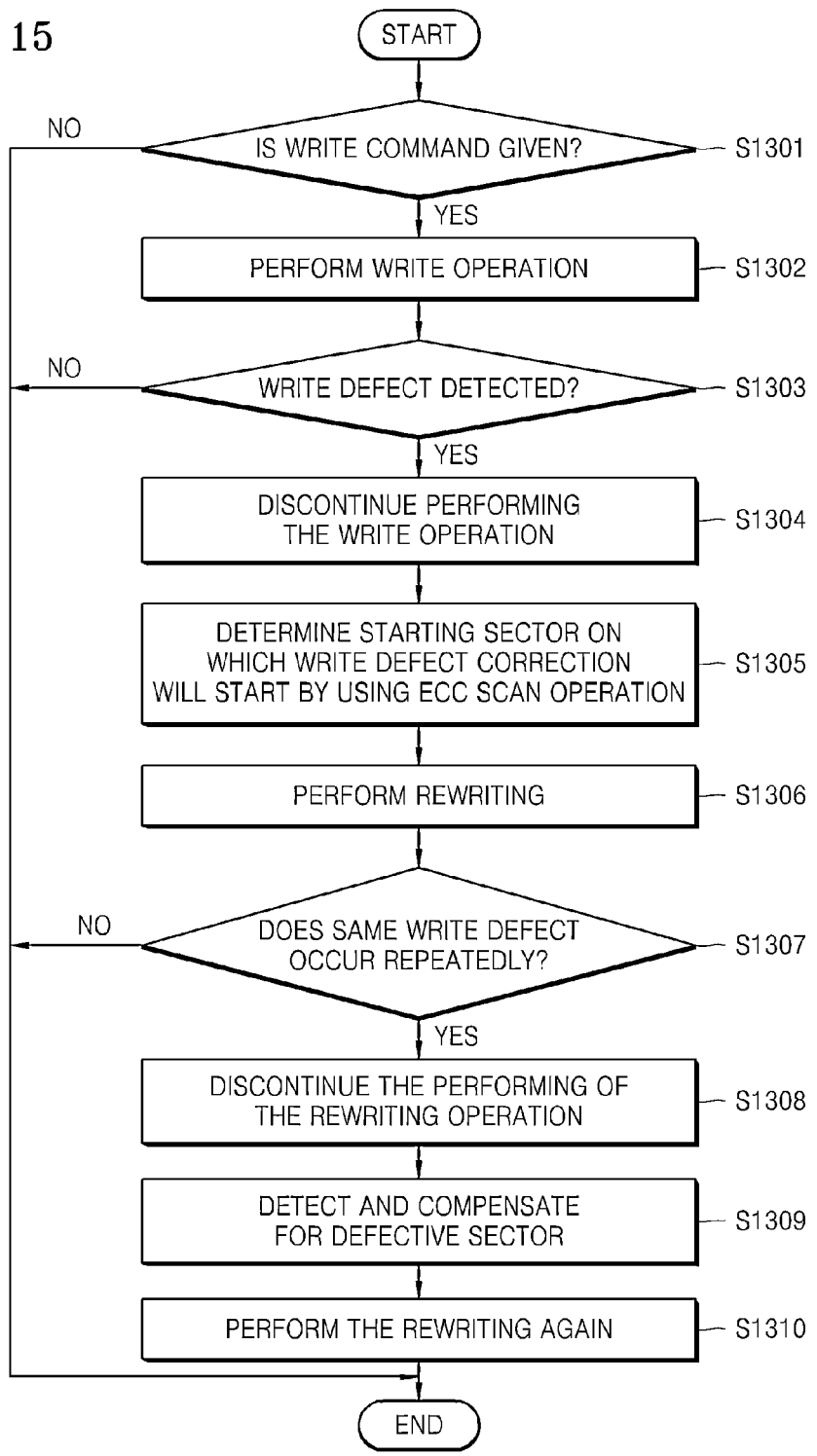
FIG. 15 is a flowchart illustrating a method of correcting a write defect in a data storage apparatus according to another embodiment of the inventive concept.

FIG. 15 illustrates a method of correcting a write defect according to another embodiment of the inventive concept. In the embodiment of FIG. 15, operations S1301 through S1306 are the same as operations S1301 through S1306 of FIG. 13.

Referring to FIG. 15, after operations S1301 through S1306 are performed, the method determines whether the same write defect occurs repeatedly during performance of a rewriting operation in S1306 (S1307). In other words, the method determines whether the same write defect occurs two or more times when a write operation is performed according to the same write command. Here, whether the same write defect occurs two or more times may be determined in the same manner as in S1303.

Where it is determined in S1307 that the same write defect occurs two or more times, the rewriting operation is discontinued (S1308). Thereafter, a defective sector is detected and compensated for by using an ECC scan operation as illustrated in FIG. 16 (S1309).

Figure 16:
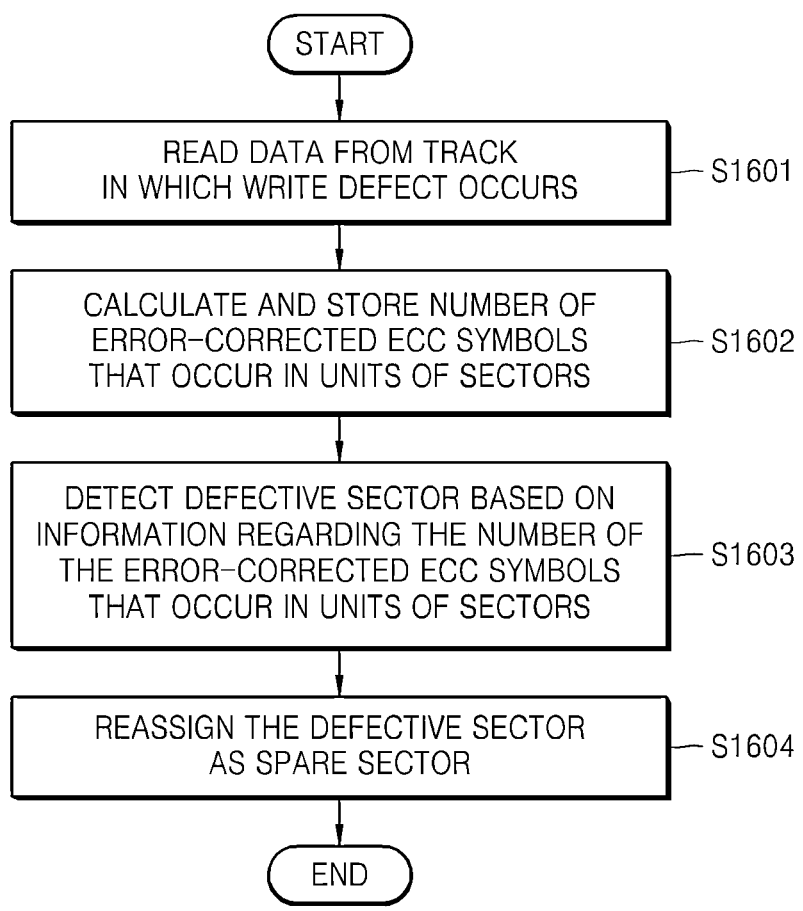
FIG. 16 is a flowchart illustrating a method of detecting and compensating for a defective sector in a data storage apparatus according to an embodiment of the inventive concept.

FIG. 16 illustrates a method of detecting and compensating for a defective sector according to an embodiment of the inventive concept.

In the method of FIG. 16, data is read from a track in which a write defect occurs (S1601). In particular, the data is read from a sector region of a track designated by a write command in which a write defect occurs.

Next, the method performs ECC scanning to determine a number of error-corrected ECC symbols that occur in units of sectors, and stores the determined numbers of error-corrected ECC symbols (S1602). In other words, ECC symbols that are error-corrected during an ECC decoding operation are detected in units of sectors from among ECC symbols included in data read by performing ECC scanning, and information regarding the number of the error-corrected ECC symbols is calculated and stored. As an example, ECC symbols in which an error occurs can be detected from among the ECC symbols by using an RS decoder, and the ECC symbols can then be error-corrected to produce the error-corrected ECC symbols. The numbers of error-corrected ECC symbols that occur in units of sectors can be summed up to generate the information regarding the number of error-corrected ECC symbols.

Next, a defective sector is detected based on the information regarding the number of error-corrected ECC symbols calculated in S1602 (S1603). For example, a sector in which the number of error-corrected ECC symbols is greater than the second threshold can be determined to be a defective sector by comparing the information regarding the number of error-corrected ECC symbols calculated in S1602 with a second threshold.

Next, the defective sector detected in S1603 is reassigned as a spare sector (S1604). Accordingly, the defective sector is prevented from being accessed in a read or write operation.

Referring back to FIG. 15, the rewriting operation is performed again, starting from the starting sector on which write defect correcting is to start, which was determined in S1305 (S1310). That is, the write operation that was discontinued due to the same write defect that occurred repeatedly is performed again starting from the starting sector on which write defect correcting is to start.

Accordingly, a sector in which an error is to occur can be precisely determined in units of sectors when a write defect occurs, and therefore, rewriting can be performed again on a sector that is potentially defective.

As indicated by the foregoing, the inventive concept can be embodied in a variety of forms, including a method, an apparatus, a system, and others. In certain embodiments, write defects are corrected in a manner that depends on a number and location of error-corrected ECC symbols in a recording medium.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method comprising:
   detecting a write defect by inspecting a signal read from a servo information region of a recording medium during a write operation;
   calculating a number of error-corrected error correction code (ECC) symbols in sectors of a track based on information read from the track;
   determining a number of sectors of the track on which write defect correction is to be performed by comparing the calculated number of error-corrected ECC symbols with a threshold; and
   performing a rewrite operation on the track, beginning at a starting sector determined by the number of sectors of the track on which write defect correction is to be performed.

2. The method of claim 1, wherein the starting sector is a sector in which the number of error-corrected ECC symbols is greater than a predetermined first threshold.

3. The method of claim 1, further comprising discontinuing a write operation upon detecting the write defect in the track.

4. The method of claim 1, wherein detecting the write defect comprises detecting that a level of a position error signal generated from a combination of burst signals read from a servo information region of the recording medium is less than a predetermined level during the write operation.

5. The method of claim 1, further comprising detecting and compensating for a defective sector in a region of the recording medium upon determining that a write defect has occurred repeatedly in the region.

6. The method of claim 5, wherein detecting and compensating for the defective sector comprises:
   reading information from the region;
   calculating a number of error-corrected ECC symbols in each sector of the region based on the information read from the region;
   identifying the defective sector as a sector of the region where the number of error-corrected ECC symbols is greater than a second threshold; and
   reassigning the defective sector as a spare sector.

7. The method of claim 6, further comprising:
   after compensating for the defective sector, performing rewriting on the track, starting from the starting sector.

8. The method of claim 1, further comprising:
   where the number of error-corrected ECC symbols is not greater than the threshold, determining a previously identified starting sector as the starting sector for write defect correction.

9. A data storage apparatus comprising:
   a recording medium;

a media interface configured to access the recording medium to write information to or read information from the recording medium; and a processor configured to discontinue performance of a write operation in response to a write defect, determine a starting sector for write defect correction based on a number of error-corrected error correction code (ECC) symbols included in information read from a track in which the write defect is located, and to control the media interface to perform rewriting starting from the starting sector.

10. The data storage apparatus of claim 9, wherein the processor comprises:

a write defect detection unit configured to detect the write defect during performance of the write operation;

a write defect correction control unit configured to control the media interface to discontinue performance of the write operation in response to detection of the write defect, to read information from a sector region of a track containing the write defect, and to perform rewriting starting from the starting sector;

and a write-defect corrected region determination unit configured to determine the starting sector.

11. The data storage apparatus of claim 10, wherein the write defect detection unit detects the write defect based on a signal read from a servo information region of the recording medium during performance of the write operation.

12. The data storage apparatus of claim 10, wherein the write defect detection unit detects the write defect by determining whether a level of a position error signal generated from burst signals read from a servo information region of the recording medium is less than an initial level during performance of the write operation.

13. The data storage apparatus of claim 10, wherein the write-defect corrected region determination unit determines the starting sector as a sector where the number of error-corrected ECC symbols is greater than a first threshold.

14. The data storage apparatus of claim 10, wherein the write-defect corrected region determination unit comprises:

an ECC processor configured to detect the error-corrected ECC symbols from among ECC symbols included in the information read from the track in which the write defect is located, and to generate information regarding the number of the error-corrected ECC symbols that occur in units of sectors;

a buffer configured to store the information regarding the number of error corrected ECC symbols; and a first determination unit configured to detect the starting sector by comparing the information regarding the number of error-corrected ECC symbols in the buffer with a first threshold.

15. The data storage apparatus of claim 10, wherein the processor further comprises:

a defective sector detection unit configured to detect a defective sector in the sector region based on a repeated occurrence of a write defect; and a defect processing controller for reassigning the defective sector as a spare sector.

16. The data storage apparatus of claim 15, wherein the defective sector detection unit comprises:

an ECC processor configured to generate information regarding numbers of error corrected ECC symbols in multiple sectors of the sector region;

a buffer configured to store the information regarding the numbers of error corrected ECC symbols that occur in the multiple sectors;

a second determination unit configured to detect a sector in which the number of error-corrected ECC symbols is greater than a second threshold by comparing the information stored in the buffer with the second threshold; and a defective sector determination unit configured to determine the sector detected by the second determination unit as the defective sector.

17. The data storage apparatus of claim 9, wherein, where the number of error-corrected ECC symbols is not greater than the threshold, the processor determines a previously identified starting sector as the starting sector for write defect correction.

18. The data storage apparatus of claim 9, wherein, if the write defect occurs repeatedly in a sector region, the processor controls the media interface to detect a defective sector in the same sector region, reassign the defective sector as a spare sector, and perform rewriting.

19. A non-transitory computer readable recording medium storing program code for executing a method of correcting a write defect, the method comprising:

detecting a write defect by inspecting a signal read from a servo information region of a recording medium;

calculating a number of error-corrected error correction code (ECC) symbols in sectors of a track based on information read from the track;

determining a number of sectors of the track on which write defect correction is to be performed by comparing the calculated number of error-corrected ECC symbols with a threshold; and performing a rewrite operation on the track, beginning at a starting sector determined by the number of sectors on which write defect correction is to be performed.

* * * * *